United States Patent
Awashima (10) Patent No.: US 8,032,853 B2
(45) Date of Patent: Oct. 4, 2011

(54) CONFIGURATION INFORMATION WRITING APPARATUS, CONFIGURATION INFORMATION WRITING METHOD AND COMPUTER PROGRAM PRODUCT

(75) Inventor: Toru Awashima, Tokyo (JP)

(73) Assignee: NEC Corporation, Tokyo (JP)

( * ) Notice: Subject to any disclaimer, the term of this patent is extended or adjusted under 35 U.S.C. 154(b) by 168 days.

(21) Appl. No.: 12/379,426

(22) Filed: Feb. 20, 2009

(65) Prior Publication Data

US 2009/0212817 A1    Aug. 27, 2009

(30) Foreign Application Priority Data

Feb. 21, 2008   (JP) ................... 2008-039872

(51) Int. Cl.
*G06F 17/50*   (2006.01)
(52) U.S. Cl. ........ 716/117; 716/110; 716/116; 716/121; 326/38; 710/62; 710/72
(58) Field of Classification Search .................. None
See application file for complete search history.

(56) References Cited

U.S. PATENT DOCUMENTS

| | | | |
|---|---|---|---|
| 6,304,101 B1 | 10/2001 | Nishihara | 326/41 |
| 6,327,634 B1 * | 12/2001 | Statovici | 710/74 |
| 6,526,557 B1 * | 2/2003 | Young et al. | 716/16 |
| 6,563,437 B1 * | 5/2003 | Landry et al. | 341/51 |
| 6,609,238 B1 * | 8/2003 | Tetelbaum | 716/122 |
| 7,249,335 B1 * | 7/2007 | Young et al. | 716/12 |
| 2003/0128140 A1 * | 7/2003 | Xie et al. | 341/107 |

FOREIGN PATENT DOCUMENTS

| | | |
|---|---|---|
| JP | 2001-028536 | 1/2001 |
| JP | 2003-347927 | 12/2003 |

OTHER PUBLICATIONS

"Configuration bitstream compression for dynamically reconfigurable FPGAs" by Ju Hwa Pan et al., Proceedings of the 2004 IEEE/ACM International Conference on Computer-aided Design, published 2004.*
An Optimal EREW PRAM Algorithm for Minimum Spanning Tree Verification, by King et al., Jul. 29, 1997.*
'Configuration Compression for Virtex FPGAs' by Zhiyuan Li and Scott Hauck, Proceedings of the the 9th Annual IEEE Symposium on Field-Programmable Custom Computing Machines, 2001.*
'Configuration Management Techniques for Reconfigurable Computing' a dissertation by Zhiyuan Li, Jun. 2002.*

(Continued)

*Primary Examiner* — Henry Tsai
*Assistant Examiner* — Steven Snyder
(74) *Attorney, Agent, or Firm* — Foley & Lardner LLP (57) ABSTRACT

A configuration information writing apparatus for writing configuration information defining a logical configuration of a logic circuit device into the logic circuit device to change the logical configuration thereof, the apparatus comprising: a difference extracting unit that acquires plural pieces of configuration information and extracts differences between each of the acquired plural pieces of configuration information; a differential relation generating unit that generates a differential relation indicating a relation of the differences between each of the plural pieces of configuration information based on the differences extracted by the difference extracting unit; and an order information generating unit that generates order information specifying an order of writing the configuration information from the relation of the differences indicated by the differential relation generated by the differential relation generating unit.

4 Claims, 11 Drawing Sheets

OTHER PUBLICATIONS

'Maintenance of a Minimum Spanning Forest in a Dynamic Plane Graph' by Eppstein et al., Nov. 11, 1991.*
IBM Technical Disclosure Bulletin NB920616, Jun. 1, 1992.*
IBM Technical Disclosure Bulletin NA920693, Jun. 1, 1992.*
IBM Technical Disclosure Bulletin NN9411473, Nov. 1, 1994.*
'Note on Counting Eulerian Circuits' by Graham Brightwell and Peter Winkler, May 2004.*
'Introduction of Graph Theory' by Jun-ichi Yamaguchi, posted at http://jwilson.coe.uga.edu/EMAT6680/Yamaguchi/emat6690/essay1/GT.html on Sep. 6, 2006.*
Archive.org showing 'Introduction of Graph Theory' by Yamaguchi being posted on Sep. 6, 2006.*
"The Travelling salesman problem", http://en.wikipedia.org/wiki/Travelling_salesman_problem, Feb. 7, 2008, 12 pages.

* cited by examiner

| ADDRESS | DATA |
|---|---|
| 0x0000 | 0x00ff |
| 0x0001 | 0x11ee |
| 0x0002 | 0x22dd |
| 0x0003 | 0x33cc |
| 0x0004 | 0x44bb |

CONFIGURATION INFORMATION A

FIG. 3B

| ADDRESS | DATA |
|---|---|
| 0x0000 | 0x11ff |
| 0x0001 | 0x22ee |
| 0x0002 | 0x22dd |
| 0x0003 | 0xaacc |
| 0x0004 | 0x44bb |

CONFIGURATION INFORMATION B

FIG. 3C

| ADDRESS | DATA |
|---|---|
| 0x0000 | |
| 0x0001 | |
| 0x0002 | 0x22dd |
| 0x0003 | |
| 0x0004 | 0x44bb |

COMMON PART BETWEEN
CONFIGURATION INFORMATION A AND B

FIG. 4A

| ADDRESS | DATA |
|---|---|
| 0x0000 | 0x00ff |
| 0x0001 | 0x11ee |
| 0x0002 | 0x22dd |
| 0x0003 | 0x33cc |
| 0x0004 | 0x44bb |

CONFIGURATION INFORMATION A

FIG. 4B

| ADDRESS | DATA |
|---|---|
| 0x0000 | 0x11ff |
| 0x0001 | 0x22ee |
| 0x0002 |  |
| 0x0003 | 0xaacc |
| 0x0004 |  |

CONFIGURATION INFORMATION B1

FIG. 4C

| ADDRESS | DATA |
|---|---|
| 0x0000 | 0x11ff |
| 0x0001 | 0x22ee |
| 0x0002 | 0x22dd |
| 0x0003 | 0xaacc |
| 0x0004 | 0x44bb |

CONFIGURATION INFORMATION B

FIG. 5A

| ADDRESS | DATA |
| --- | --- |
| 0x0000 | 0x11ff |
| 0x0001 | 0x22ee |
| 0x0002 | 0x22dd |
| 0x0003 | 0xaacc |
| 0x0004 | 0x44bb |

CONFIGURATION INFORMATION B

FIG. 5B

| ADDRESS | DATA |
| --- | --- |
| 0x0000 | 0x00ff |
| 0x0001 | 0x11ee |
| 0x0002 | |
| 0x0003 | 0x33cc |
| 0x0004 | |

CONFIGURATION INFORMATION A1

FIG. 5C

| ADDRESS | DATA |
| --- | --- |
| 0x0000 | 0x00ff |
| 0x0001 | 0x11ee |
| 0x0002 | 0x22dd |
| 0x0003 | 0x33cc |
| 0x0004 | 0x44bb |

CONFIGURATION INFORMATION A

CONFIGURATION INFORMATION WRITING APPARATUS, CONFIGURATION INFORMATION WRITING METHOD AND COMPUTER PROGRAM PRODUCT

BACKGROUND OF THE INVENTION

1. Field of the Invention

The present invention relates to a configuration information writing apparatus, configuration information writing method and a computer program product, which compress the total amount of information to be written into a logic circuit device to change the logical configuration thereof.

2. Description of the Related Art

FPGA (Field Programmable Gate Array) is known as a logic circuit device having a function of changing a logical configuration (being reconfigurable). Some FPGAs achieve a fast input/output operation by compressing data using run length encoding (see, for example, Unexamined Japanese Patent Application KOKAI Publication No. 2003-347927).

There is a technique which compresses information by omitting information on a repetitive part included in configuration information (frame) (see, for example, Unexamined Japanese Patent Application KOKAI Publication No. 2001-28536 (FIG. 2)). The partial omission of the configuration information provides the compression of the total amount of the information to be written.

SUMMARY OF THE INVENTION

The techniques disclosed in Unexamined Japanese Patent Application KOKAI Publication Nos. 2003-347927 and 2001-28536, however, need a repetitive part in configuration information. In addition, when information is repeated over different pieces of configuration information, the information cannot be compressed. In handling plural pieces of configuration information, therefore, a new suitable approach is demanded to compress the total amount of configuration information to be written.

In consideration of the foregoing problems, it is an object of the present invention to provide a configuration information writing apparatus, configuration information writing method and computer program product suitable for compressing the total amount of information to be written into a logic circuit device to change the logical configuration thereof.

To achieve the object, according to a first aspect of the invention, there is provided a configuration information writing apparatus for writing configuration information defining a logical configuration of a logic circuit device into the logic circuit device to change the logical configuration thereof, the apparatus comprising:

a difference extracting unit that acquires plural pieces of configuration information and extracts differences between each of the acquired plural pieces of configuration information;

a differential relation generating unit that generates a differential relation indicating a relation of the differences between each of the plural pieces of configuration information based on the differences extracted by the difference extracting unit; and an order information generating unit that generates order information specifying an order of writing the configuration information from the relation of the differences indicated by the differential relation generated by the differential relation generating unit.

To achieve the object, according to a second aspect of the invention, there is provided a configuration information writing method to be executed by a configuration information writing apparatus for writing configuration information defining a logical configuration of a logic circuit device into the logic circuit device to change the logical configuration thereof, the method comprising:

a difference extracting step of acquiring plural pieces of configuration information and extracting differences between each of the acquired plural pieces of configuration information;

a differential relation generating step of generating a differential relation indicating a relation of the differences between each of the plural pieces of configuration information based on the differences extracted by the difference extracting step; and an order information generating step of generating order information specifying an order of writing the configuration information from the relation of the differences indicated by the differential relation generated by the differential relation generating step.

To achieve the object, according to a third aspect of the invention, there is provided a computer-readable computer program product recording a computer program which allows a computer for writing configuration information defining a logical configuration of a logic circuit device into the logic circuit device for changing the logical configuration thereof to execute:

a difference extracting step of acquiring plural pieces of configuration information and extracting differences between each of the acquired plural pieces of configuration information;

a differential relation generating step of generating a differential relation indicating a relation of the differences between each of the plural pieces of configuration information based on the differences extracted by the difference extracting step; and an order information generating step of generating order information specifying an order of writing the configuration information from the relation of the differences indicated by the differential relation generated by the differential relation generating step.

DETAILED DESCRIPTION OF THE PREFERRED EMBODIMENTS

While the following describes preferred embodiments of a configuration information writing apparatus according to the present invention, the embodiments are given to facilitate the understanding of the principle of the invention. The scope of the invention is not limited to the embodiments. Therefore, other embodiments which are the following embodiments adequately modified by those skilled in the art are also encompassed in the scope of the invention.

To begin with, the fundamental properties that are premised to write configuration information into a logic circuit device having a function of changing (being capable of reconfiguring) a logical configuration will be described referring to FIGS. 3 to 5. The configuration information is data defining a logical configuration.

Figure 3A:
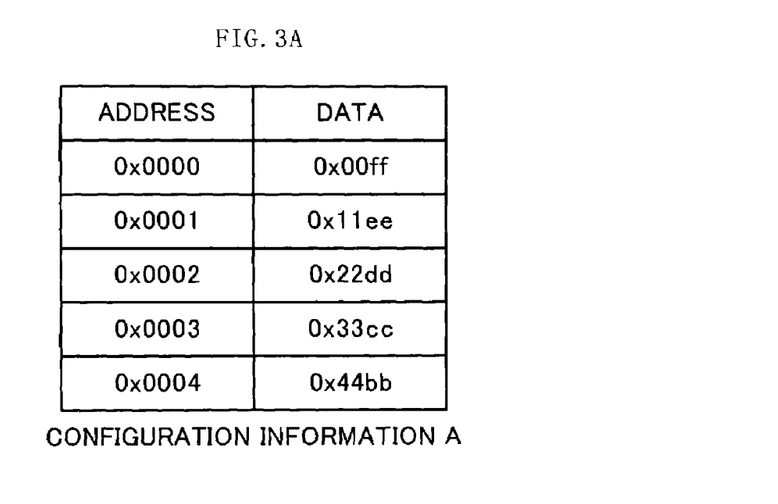
FIGS. 3A to 3C are diagrams showing examples of configuration information.
Figure 3B:
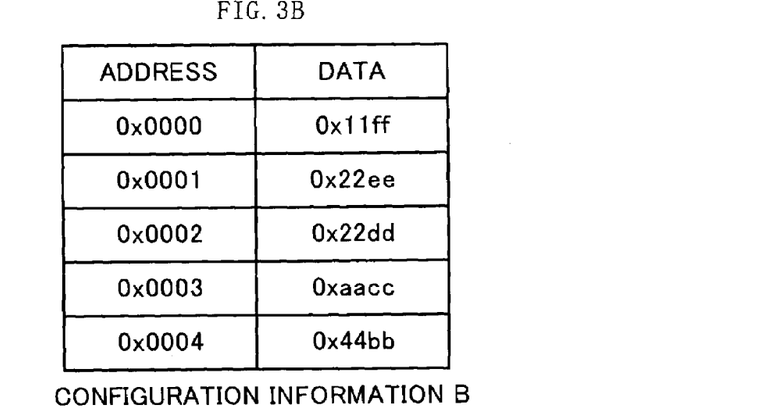

FIGS. 3A and 3B show examples of configuration information the logic circuit device has. The configuration information is generally expressed by a set consisting of an address of a configuration information memory and data. The configuration information shown in FIGS. 3 to 5 consists of five words each having a width of 16 bits.

Configuration information A and B shown in FIGS. 3A and 3B have common words. In this case, two hatched words in FIG. 3C are common data to the configuration information A and B.

When there is common data, data (difference data) other than the common data is written in configuration information.

A method of rewriting the configuration information A to the configuration information B with nothing being written in the common data will be described referring to FIGS. 4A to 4C. The configuration information B shown in FIG. 4C can be generated by writing three words (difference data) contained in configuration information BI shown in FIG. 4B into the configuration information A shown in FIG. 4A.

Likewise, a method of rewriting the configuration information B to the configuration information A will be described referring to FIGS. 5A to 5C. The configuration information A shown in FIG. 5C can be generated by writing three words (difference data) contained in configuration information Al shown in FIG. 5B into the configuration information B shown in FIG. 5A.

In this manner, configuration information is written into the logic circuit device to change the logical configuration thereof. Then, words of data (difference data) other than the common data are rewritten to ensure compression of the total amount of configuration information to be written at the time of writing the configuration information. The following description is premised on those configuration information writing methods.

First Embodiment

A configuration information writing apparatus according to the first embodiment of the invention will be described referring to FIGS. 1A and 1B.

Figure 1A:
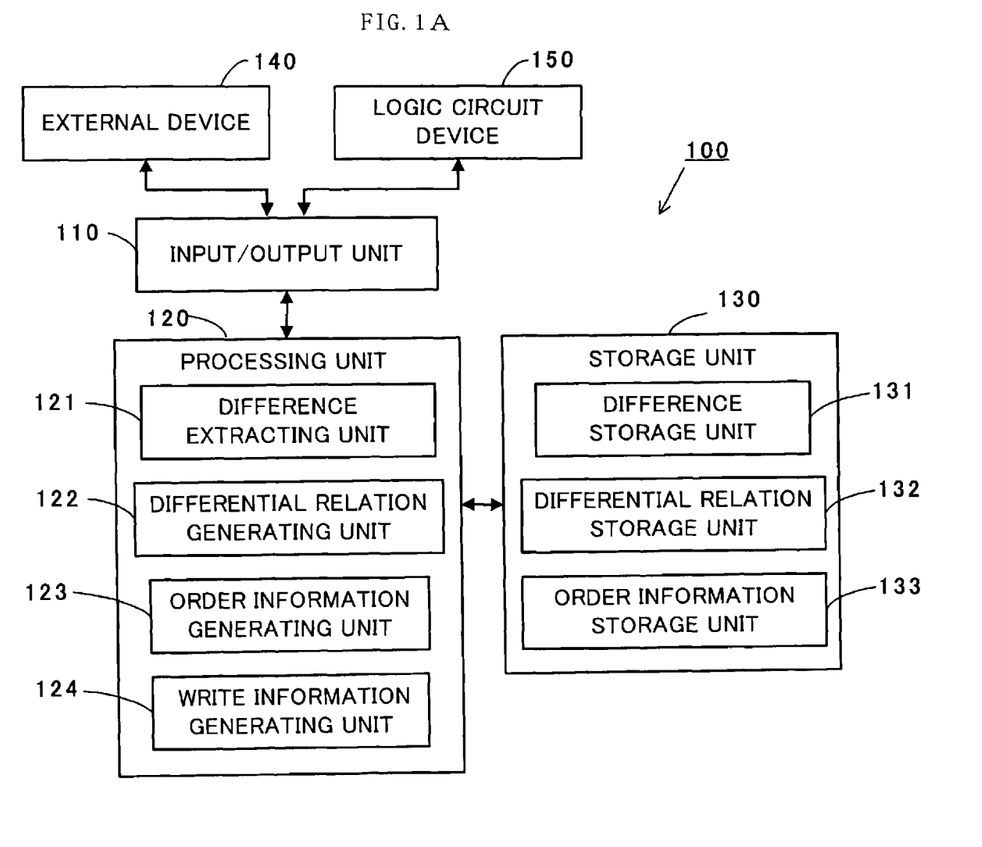
FIG. 1A is a block diagram showing the configuration of a configuration information writing apparatus according to a first embodiment of the present invention.

A configuration information writing apparatus 100 of the embodiment has an input/output unit 110, a processing unit 120 and a storage unit 130 as shown in FIG. 1A. The configuration information writing apparatus 100 writes configuration information defining the logical configuration of a logic circuit device 150 into the logic circuit device 150 to change the logical configuration thereof.

The input/output unit 110 reads plural pieces of configuration information from an external device 140, and hands over the configuration information to the processing unit 120. Further, the input/output unit 110 writes configuration information (difference data) for writing the difference output from the processing unit 120 into the logic circuit device 150. The configuration information is written into the logic circuit device 150 this way to change the logical configuration thereof.

The processing unit 120 has a difference extracting unit 121, a differential relation generating unit 122, an order information generating unit 123, and a write information generating unit 124.

Figure 1B:
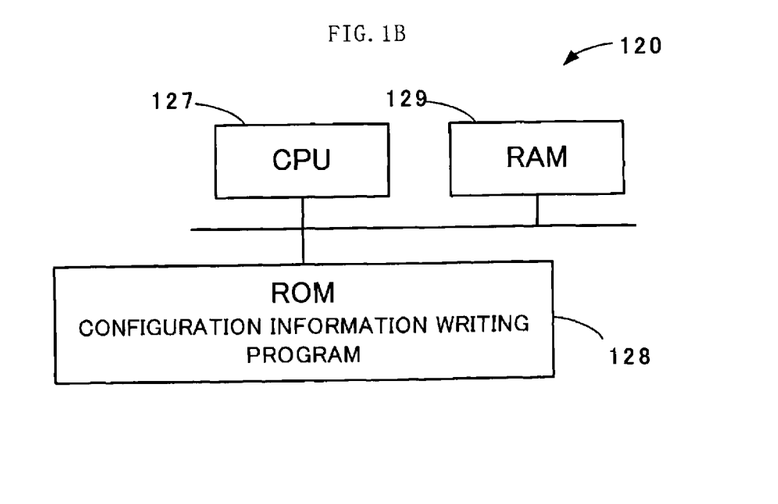
FIG. 1B is a diagram showing one example of the hardware configuration of a processing unit in the configuration information writing apparatus according to the first embodiment of the invention.

As shown in FIG. 1B, the processing unit 120 has, for example, a CPU (Central Processing Unit) 127, ROM (Read Only Memory) 128, and a RAM (Random Access Memory) 129. A configuration information writing program is recorded in the ROM 128. The configuration information writing program is placed in the RAM 129. The CPU 127 executes processes to be described later according to the configuration information writing program placed in the RAM 129. The configuration information writing program may cooperate with OS (operating system) to cause the CPU to perform the processes described below. In this way, the configuration information writing program cause the computer to perform the processes described later.

The configuration information writing program may be recorded in a portable information storage medium, such as CD-ROM, to be installed in the configuration information writing apparatus 100. In this case, the configuration information writing program is recorded in, for example, the storage unit 130. The configuration information writing program may be downloaded over a network to be installed in the configuration information writing apparatus 100.

A computer-readable storage medium such as the storage unit 130, ROM 128, RAM 129 or portable computer-readable information storage medium in which the configuration information writing program is recorded is one example of a computer program product having the configuration information writing program recorded therein.

The storage unit 130 has a difference storage unit 131, a differential relation storage unit 132 and a order information storage unit 133.

The storage unit 130 comprises a storage device, such as a flash memory or hard disk. The storage unit 130 can be of any type as long as it can be accessed by the configuration information writing apparatus 100. Accordingly, at least a part of the memory area of the storage unit 130 may be formed in a device external to the configuration information writing apparatus 100. The external device is, for example, a server capable of communicating with the configuration information writing apparatus 100 over a network. In this case, the configuration information writing apparatus 100 accesses the memory area over the network.

The difference extracting unit 121 acquires plural pieces of configuration information from the input/output unit 110. For example, the difference extracting unit 121 may acquire plural pieces of configuration information from the storage unit 130 storing the plural pieces of configuration information. The difference extracting unit 121 acquires plural pieces of configuration information in this manner.

Figure 3C:
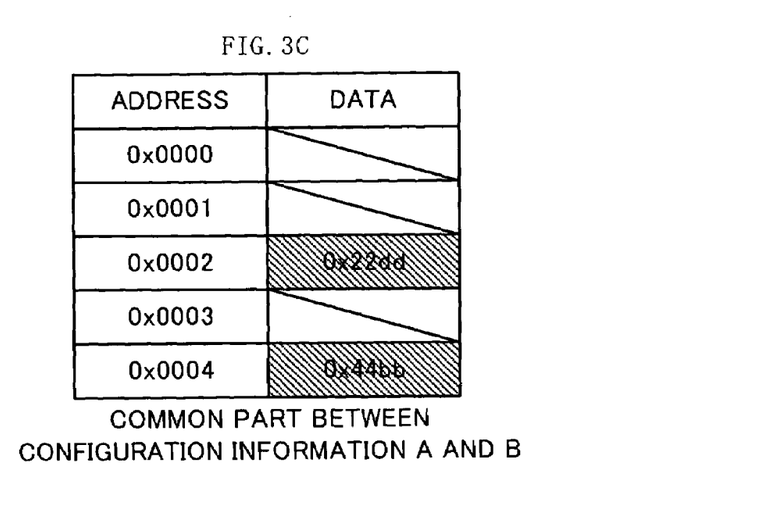

As shown in FIG. 3C, the difference extracting unit 121 extracts differences for all the sets of the plurality of configuration information acquired. The difference extracting unit 121 extracts differences (data each indicating a difference) between each of the acquired plural pieces of configuration information in this way. The acquired configuration information is, for example, configuration information input from the input/output unit 110 or acquired from the storage unit 130. Further, the difference extracting unit 121 stores the differences to the difference storage unit 131.

The differential relation generating unit 122 generates a differential relation (data indicating a differential relation) for the entire configuration information by referring to differences stored in the difference storage unit 131. That is, the differential relation generating unit 122 generates a differential relation indicating a relation of differences between each of the plural pieces of configuration information based on the differences extracted by the difference extracting unit 121. The differential relation generating unit 122 stores the generated differential relation in the differential relation storage unit 132.

Figure 6A:
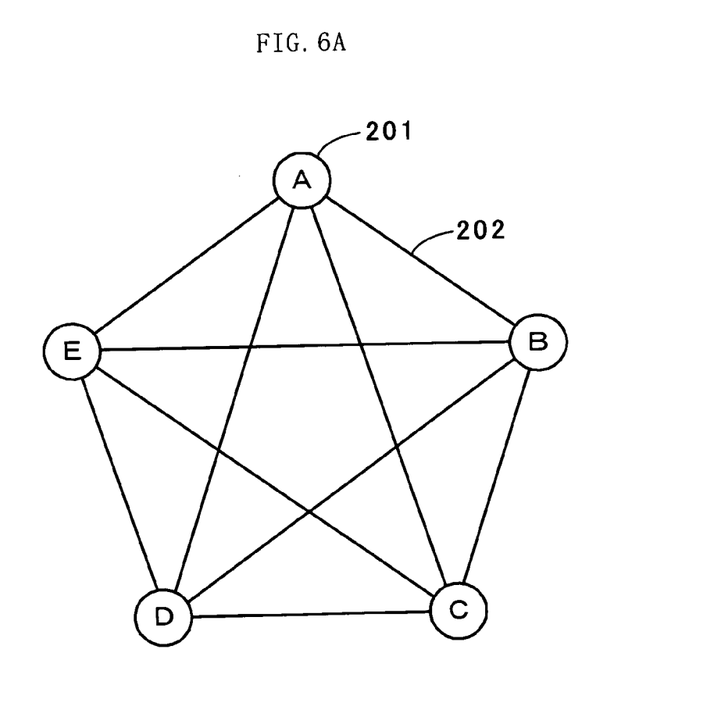
FIG. 6A is a diagram showing a differential relation according to the first embodiment.
Figure 6B:
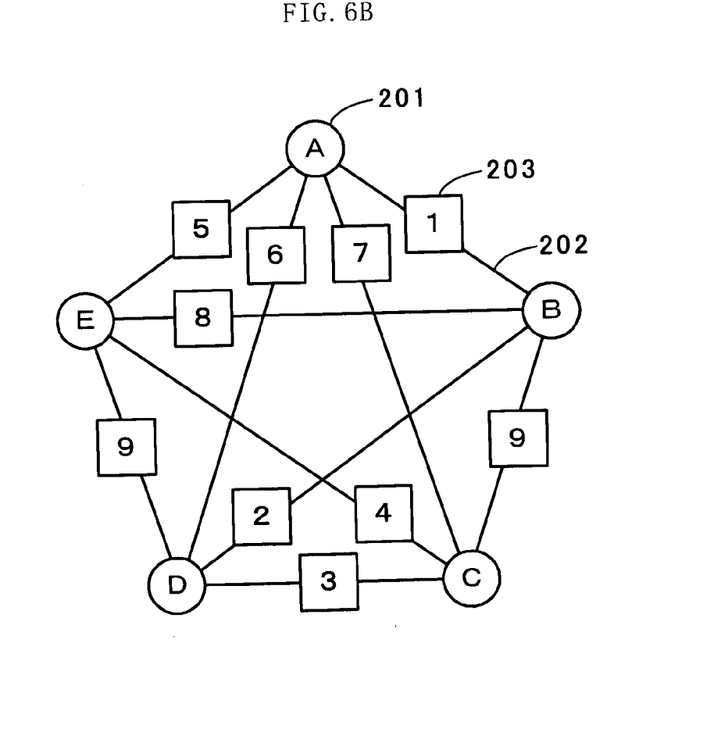
FIG. 6B is a diagram showing a weighted differential relation.

As shown in FIGS. 6A and 6B, the differential relation is information (data) which expresses the relation of individual pieces of configuration information with nodes (data each indicating a node) 201 specifying configuration information, edges (data each indicating an edge) 202 connecting between each of the nodes 201, and edge weights (data each indicating the lightness/heaviness of the edge 202) 203 specifying the lightness/heaviness of the edges 202. The edge 202 is connected to the associated nodes 201. The edges 202 are formed between the respective nodes 201. In case of reconfiguration from configuration information on one side of the edge 202 to configuration information on the other side, each edge 202 is weighted based on the number of words of configuration information which need writing.

The weighted information is the edge weight 203. The edge weight 203 is, for example, the numeral of the rank of the number of words that need to be written for each edge. In this case, an edge which has a smallest number of such words has the first rank. In case where edges have the same rank, the numeral of the same rank becomes the edge weight 203. In this case, a next rank may be the numeral of the same rank added with "1" or added with the number of edges of the same rank. When there are three edges of the second rank, for example, a next edge may be "3" or "5". The edge weight 203 becomes heavier as the number of words that need writing is smaller, and becomes lighter as the number of words that need writing is larger. Becoming heavier means that, for example, the numeral becomes smaller, whereas becoming lighter means that, for example, the numeral becomes larger.

The order information generating unit 123 generates write order information which is data on a write order method to minimize the number of words to be written (the total amount of configuration information that needs writing for reconfiguration) by referring to the differential relation stored in the differential relation storage unit 132. The write order information is order information (data indicating an order) specifying the order of writing configuration information. The order information generating unit 123 generates order information specifying the order of writing the configuration information from the relation of the differences indicated by the differential relation generated by the differential relation generating unit 122 in the above manner. The order information generating unit 123 then stores the order information in the order information storage unit 133.

The process of generating the order information is, for example, a process of generating order information which minimizes the sum of the edge weights 203. This process results in a problem of acquiring a circulation circuit on the differential relation that, for example, passes all the nodes 201 once and that minimizes the sum of the edge weights 203 of edges passed. This problem can be solved by using the solution of the "traveling salesman problem". See the URL "http://en.wikipedia.org/wiki/Traveling_salesman_problem" for this solution. In other words, the order information generating unit 123 generates order information which minimizes the sum of edge weights 203 using the traveling salesman problem.

The write information generating unit 124 generates write information which minimizes the number of words to be written by referring to the differences stored in the difference storage unit 131 and the order information stored in the order information storage unit 133.

Figure 2:
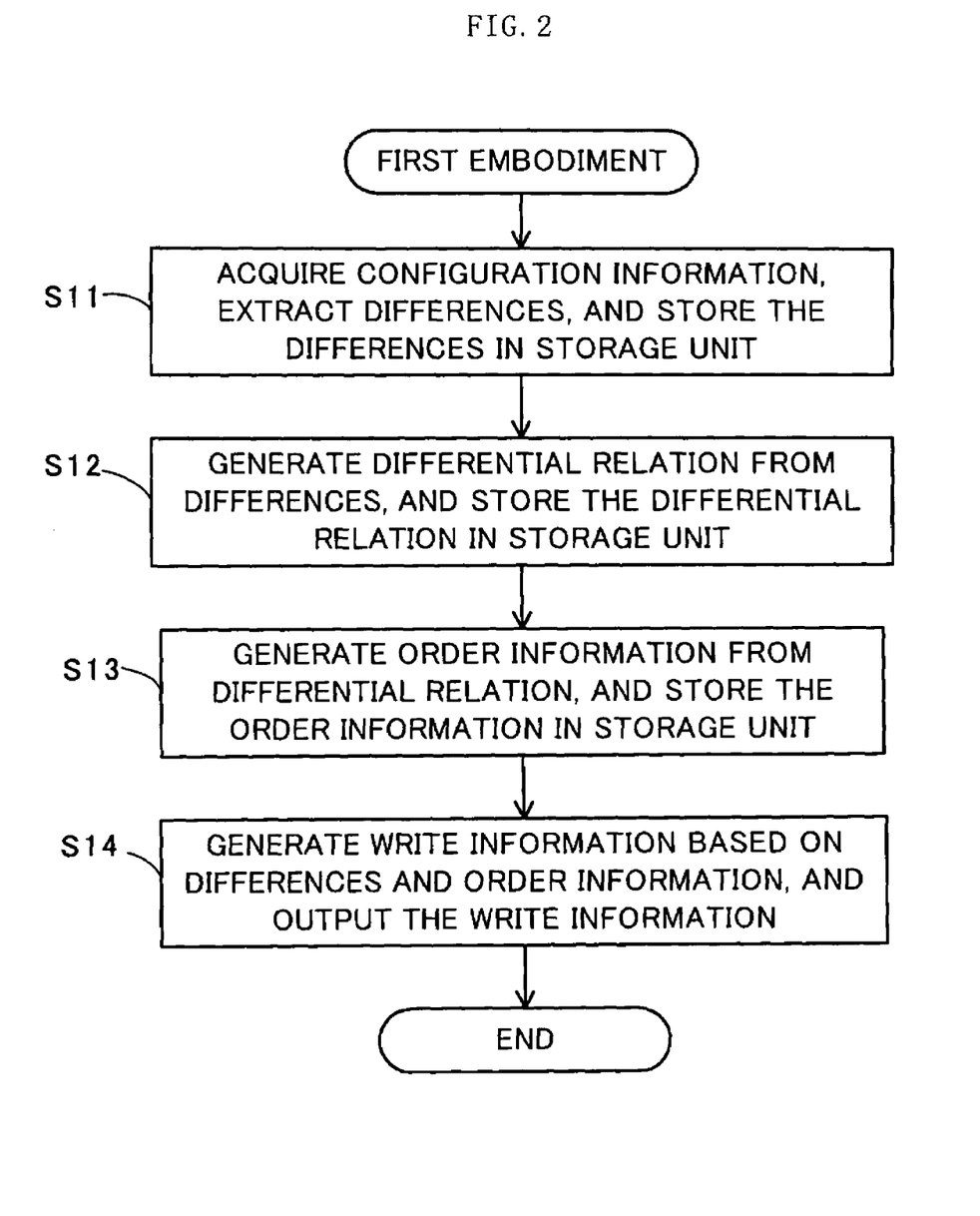
FIG. 2 is a flowchart illustrating a process which is executed by the configuration information writing apparatus according to the first embodiment.

Next, the processes that the configuration information writing apparatus 100 according to the embodiment executes will be described referring to FIGS. 2, 6 and 7.

First, plural pieces of configuration information given from the input/output unit 110 or the like are supplied to the difference extracting unit 121. The difference extracting unit 121 extracts differences for all the sets of configuration information shown in FIGS. 3A and 3B, for example, and stores the differences in the difference storage unit 131 (step S11).

Figure 4A:
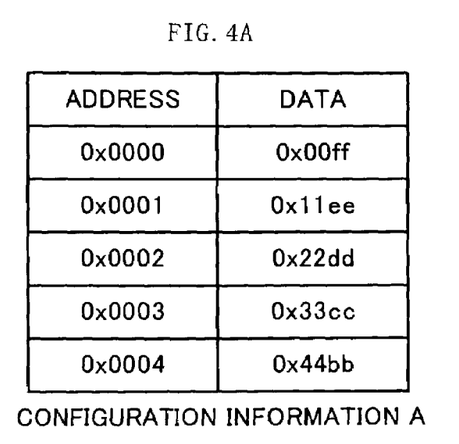
FIGS. 4A to 4C are diagrams illustrating a method of writing configuration information, FIG. 4A showing configuration information before being written, FIG. 4B showing configuration information containing difference data, FIG. 4C showing configuration information after being written.
Figure 4B:
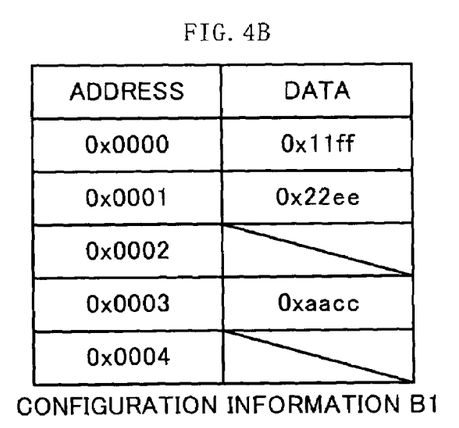
Figure 4C:
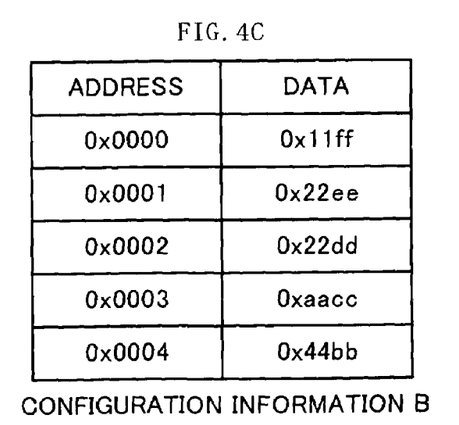
Figure 5A:
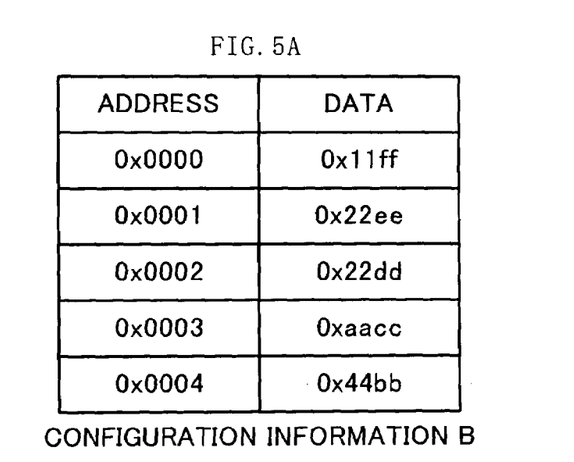
FIGS. 5A to 5C are diagrams illustrating a method of writing configuration information, FIG. 5A showing configuration information before being written, FIG. 5B showing configuration information containing difference data, FIG. 5C showing configuration information after being written.
Figure 5B:
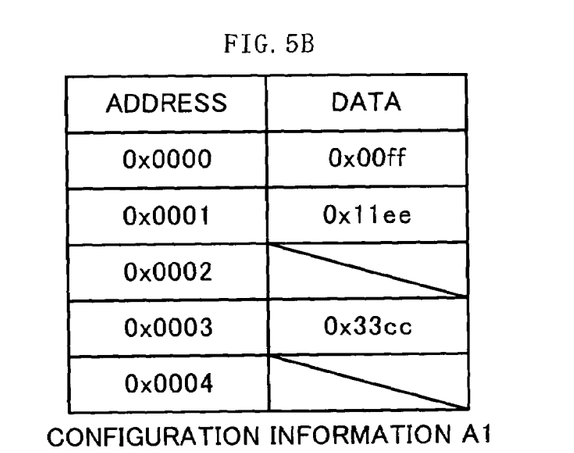
Figure 5C:
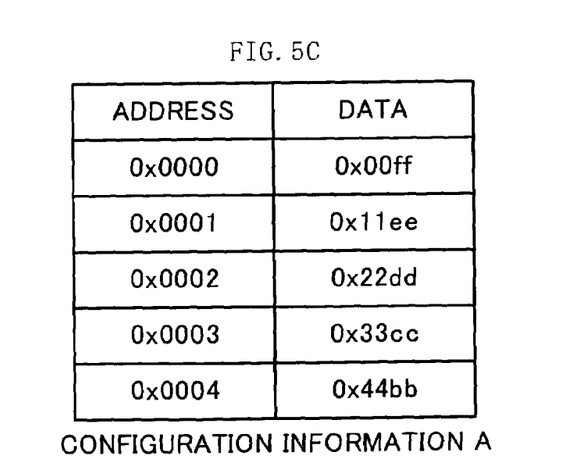

As shown in FIGS. 4 and 5, for a set of configuration information, the configuration information A and configuration information B, the "difference" to be stored in the difference storage unit 131 includes minimum configuration information B1 that needs writing at the time of reconfiguring the configuration information B from the configuration information A, the number of words of the configuration information B1, minimum configuration information A1 that needs writing at the time of reconfiguring the configuration information A from the configuration information B, and the number of words of the configuration information A1.

Next, the differential relation generating unit 122 generates a differential relation of configuration information by referring to the differences stored in the difference storage unit 131. The differential relation generating unit 122 also stores the differential relation in the differential relation storage unit 132 (step S12).

As shown is FIGS. 6A and 6B, the "differential relation" is information which expresses each configuration information with the nodes 201 and the relation of pieces of configuration information with the edges 202. The individual edges 202 are formed between all the nodes 201. In case where of reconfiguration from configuration information on one side of the edge 202 to configuration information on the other side, each edge 202 is weighted based on the number of words of configuration information which need writing. This weighted information is the edge weight 203.

Next, the order information generating unit 123 generates order information to minimize the number of words that needs writing for reconfiguration by referring to the differential relation stored in the differential relation storage unit 132. The order information generating unit 123 then stores the order information in the order information storage unit 133 (step S113).

Figure 7A:
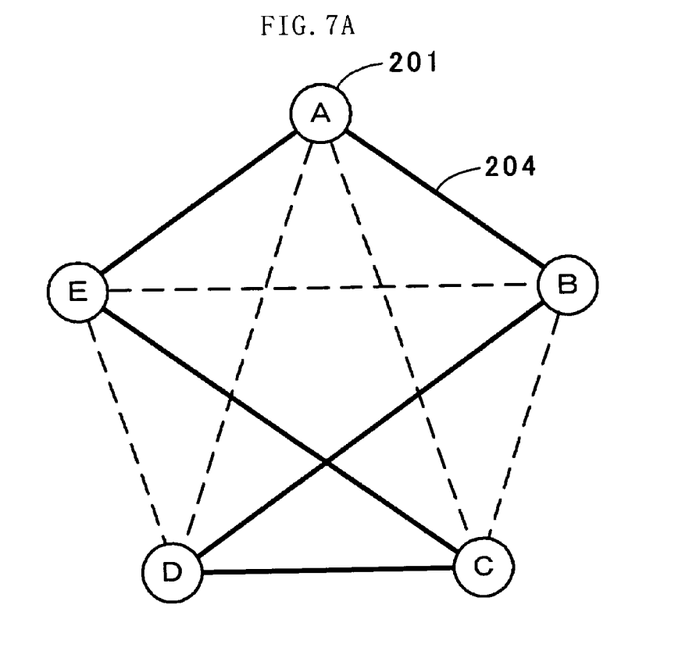
FIG. 7A is a diagram showing a writing circulation circuit according to the first embodiment.
Figure 7B:
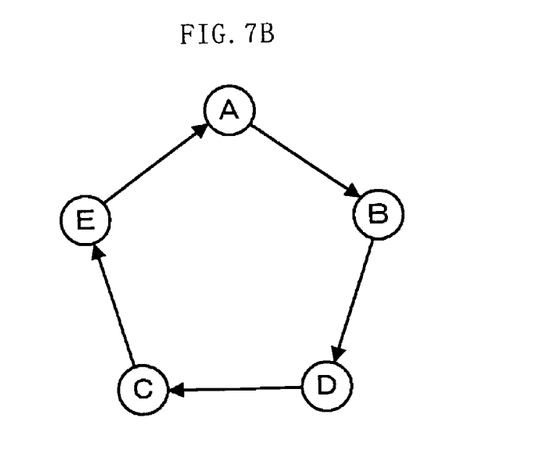
FIG. 7B is a diagram showing a forward circulation circuit.
Figure 7C:
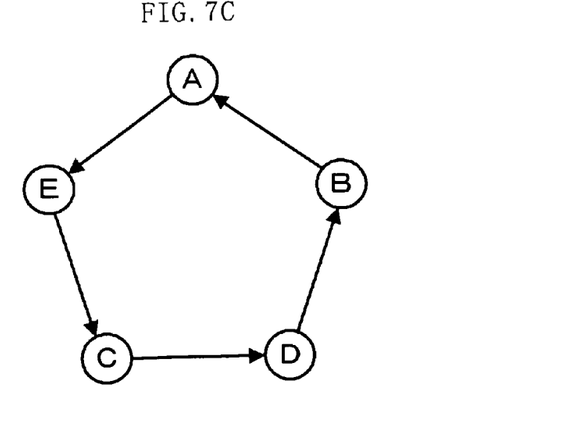
FIG. 7C is a diagram showing a reverse circulation circuit.

As shown in FIG. 7A, the process of step S13 results in a problem of acquiring a circulation circuit 204 that passes all the nodes 201 once and minimizes the sum of the edge weights 203 of edges passed on the differential relation. This problem can be solved by using the solution of the "traveling salesman problem". In this example, the circulation circuit 204 with minimum sum of the edge weights, here 15, is acquired, and order information is generated based on the circulation circuit 204.

The embodiment handles a case where the configuration information writing apparatus 100 repeatedly executes a plurality of circuit configurations in an arbitrary order. The order information in configuration information which is acquired by the order information generating unit 123 is information of the circulation order whose start point and end points are not set.

As shown in FIGS. 4A to 4C and 5A to 5C, the number of words in a difference does not change even if the rewriting direction is changed e.g. from the configuration information A to the configuration information B, or from the configuration information B to the configuration information A. Therefore, the write order which is acquired as a result is two circulation orders, namely a forward circulation order and a reverse circulation order, as shown in FIGS. 7B and 7C.

Finally, the write information generating unit 124 generates write information to minimize the total amount of configuration information (the number of words to be written) that is necessary in the case where the configuration information writing apparatus 100 repeatedly executes a plurality of circuit configurations in an arbitrary order by referring to the differences and order information respectively stored in the difference storage unit 131 and the order information storage unit 133. The write information includes, for example, data in configuration information for writing a difference (difference data) and data on the write order. The write information generating unit 124 outputs the difference writing configuration information to the input/output unit 110 according to the write order, and then terminates the process (step S114). The input/output unit 110 writes the difference writing configuration information, output from the write information generating unit 124, in the logic circuit device 150. In this way, the configuration information writing apparatus 100 writes configuration information defining the logical configuration of the logic circuit device 150 into the logic circuit device 150 to change the logical configuration thereof.

In step S14, which one of the two circulation orders acquired in step S13 is to be selected or which configuration information is set as the start point is given from the input/output unit 110 or is automatically determined by the write information generating unit 124 based on a proper index.

As described above, the configuration information writing apparatus 100 according to the embodiment extracts difference information for every set of configuration information and executes the processes based on the differential relation based on the difference information, so that the configuration information writing apparatus 100 can generate the order information and write information for plural pieces of (two or more pieces of) configuration information.

As the configuration information writing apparatus 100 according to the embodiment acquires a write order by acquiring the circulation circuit that minimizes the sum of the weights on the differential relation, the configuration information writing apparatus 100 can generate order information and write information that minimize the total writing amount.

Second Embodiment

Figure 8:
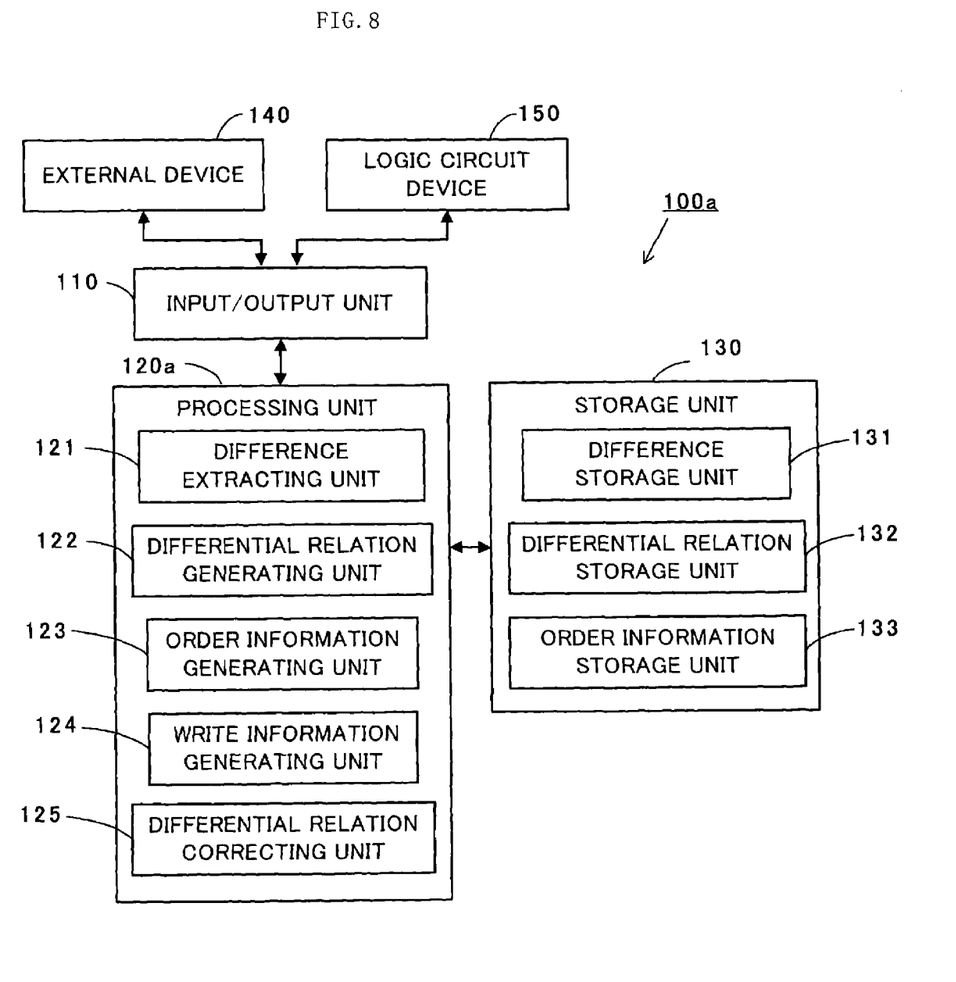
FIG. 8 is a block diagram showing the configuration of a configuration information writing apparatus according to a second embodiment of the invention.

Next, a configuration information writing apparatus 100a according to the second embodiment of the invention will be described referring to FIG. 8. The configuration information writing apparatus 100a according to the second embodiment is configured to have a differential relation correcting unit 125 added to the processing unit 120 of the configuration information writing apparatus 100 shown in FIG. 1 (see the processing unit 120a). In the second embodiment, the configuration information writing apparatus 100a executes a plurality of circuit configurations only once in an arbitrary order.

Figure 10A:
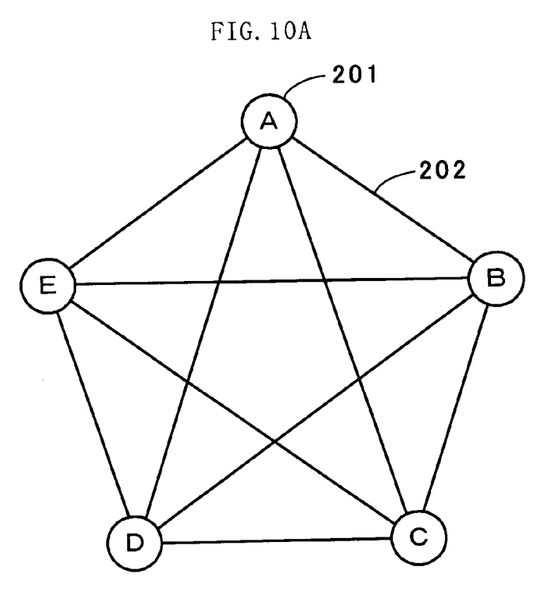
FIG. 10A is a diagram showing a differential relation according to the second embodiment.
Figure 10B:
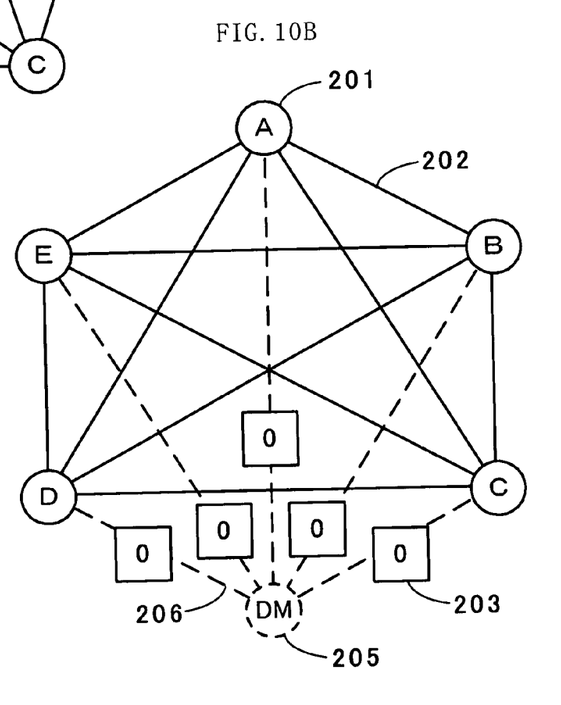
FIG. 10B is a diagram showing a weighted differential relation.

The differential relation correcting unit 125 refers to the differential relation stored in the differential relation storage unit 132 to insert one dummy node 205 shown in FIG. 10B in the differential relation. The differential relation correcting unit 125 stores the differential relation again in the differential relation storage unit 132.

Figure 9:
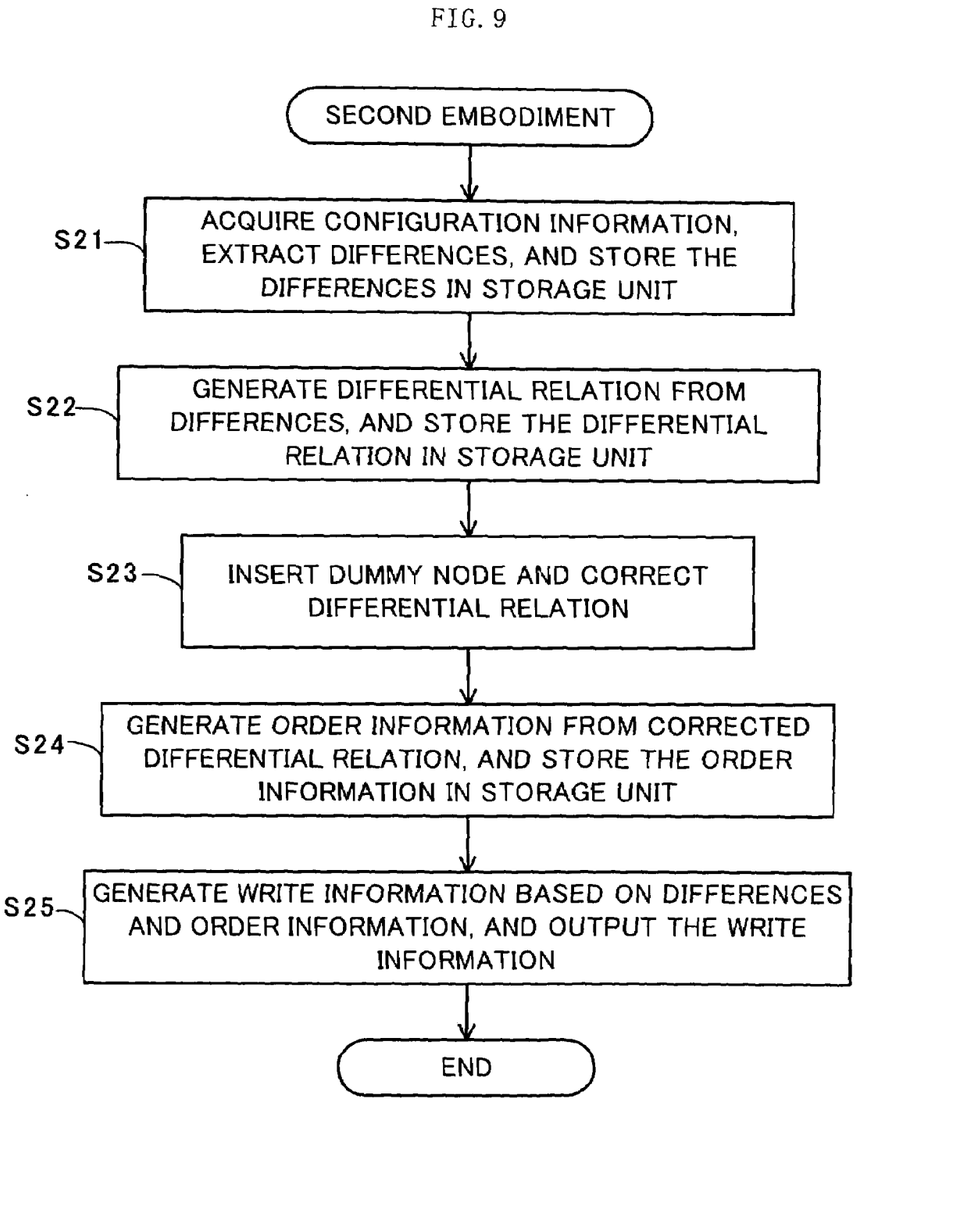
FIG. 9 is a flowchart illustrating the operation of the configuration information writing apparatus according to the second embodiment.

Next, the operation of the configuration information writing apparatus 100a according to the embodiment will be described referring to FIGS. 9 to 11. Note that processes similar to those of steps S11 and S12 are executed in steps S21 and S22, respectively. Likewise, a process similar to that of step S14 is executed in step S25.

The differential relation correcting unit 125 refers to the differential relation stored in the differential relation storage unit 132 to insert one dummy node 205 in the differential relation as shown in FIG. 10B. Further, as shown in FIG. 10B, the differential relation correcting unit 125 newly provides a dummy edge 206 between the inserted dummy node 205 and every node 201 different therefrom, and initializes the edge weight 203 to "0". The differential relation correcting unit 125 stores the differential relation again in the differential relation storage unit 132 (step S23).

Next, the order information generating unit 123 generates order information to minimize the number of words that need writing for reconfiguration by referring to the differential relation stored again in the differential relation storage unit 132. The order information generating unit 123 also stores the order information in the order information storage unit 133 (step S24).

Figure 11A:
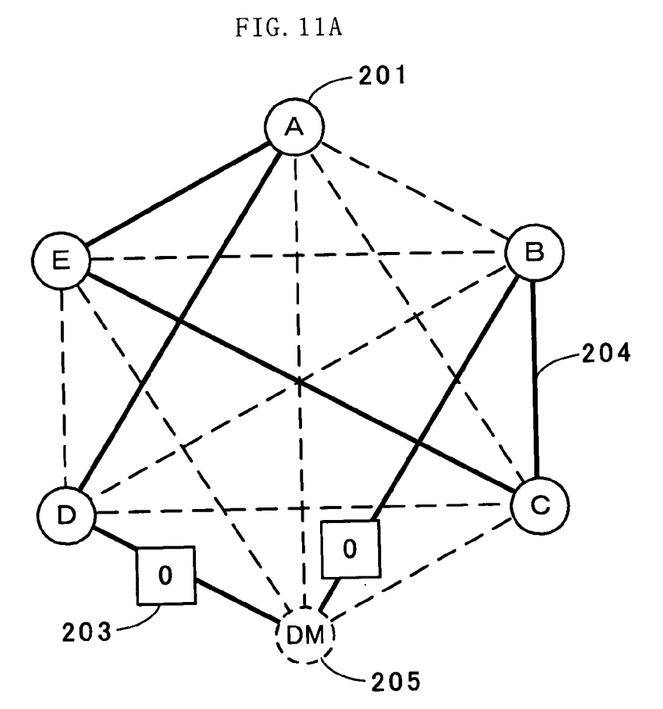
FIG. 11A is a diagram showing a writing circulation circuit according to the second embodiment.
Figure 11B:
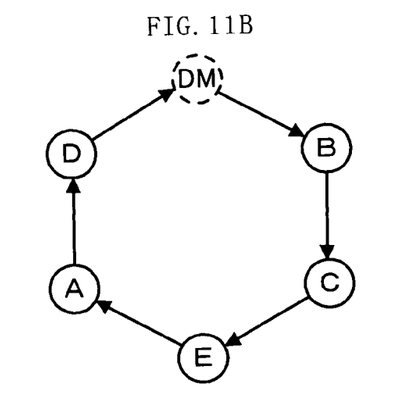
FIG. 11B is a diagram showing a forward circulation circuit.
Figure 11C:
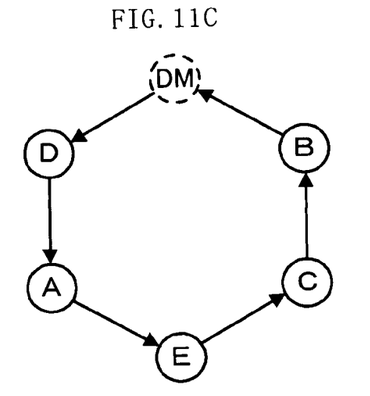
FIG. 11C is a diagram showing a reverse circulation circuit.

As shown in FIG. 11A, the process of step S24 results in a problem of acquiring a circulation circuit 204 on the differential relation that passes all the nodes 201 once and that minimizes the sum of the edge weights 203 of edges passed. The write order which is acquired as a result is two circulation orders, namely a forward circulation order and a reverse circulation order, as shown in FIGS. 11B and 11C.

In step S24, one dummy node 205 is inserted to correct the differential relation. As a result, the circulation circuit 204 that minimizes the sum of the edge weights 203 and that is acquired in step S24 always includes the dummy node 205. The edge weights 203 of the dummy edges 206 before and after the dummy node 205 in the circulation circuit 204 are initialized to "0", and does not affect the sum of the edge weights 203 of the circulation circuit 204. Therefore, the write information that minimizes the sum of the edge weights 203 and has a start point and end point can be generated by removing the dummy node 205 from the acquired circulation circuit 204.

As described above, the configuration information writing apparatus 100a according to the second embodiment acquires a write order by acquiring the circulation circuit that minimizes the sum of the edge weights on the differential relation, so that the configuration information writing apparatus 100a can generate the order information and write information that minimize the total writing amount.

The invention is not limited to the foregoing embodiments, and can be modified and adapted in various forms.

The number of pieces of configuration information is not limited to two, and is any number equal to or greater than two.

Data in configuration information is not limited to five words and is arbitrary. The bit width of each word is not limited to 16 bits and is arbitrary.

The method of acquiring a circulation circuit is an optional method, such as linear programming, annealing or genetic algorithm.

The configuration information writing apparatus, configuration information writing method and computer program product according to each of the foregoing embodiments can compress the total amount of information to be written in a logic circuit device having a function of changing the logical configuration thereof.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2008-039872 filed on Feb. 21, 2008 and including specification, claims, drawings and summary. The disclosure of the above Japanese Patent Application is incorporated herein by reference in its entirety.

What is claimed is:

1. A configuration information writing apparatus for writing configuration information defining a logical configuration of a logic circuit device into the logic circuit device to change the logical configuration thereof, the apparatus comprising:
   a difference extracting unit that acquires plural pieces of configuration information and extracts differences between each of the acquired plural pieces of configuration information;
   a differential relation generating unit that generates a differential relation indicating a relation of the differences between each of the plural pieces of configuration information based on the differences extracted by the difference extracting unit;
   an order information generating unit that generates order information specifying a circulation order of writing all the pieces of configuration information, from the relation of the differences indicated by the differential relation generated by the differential relation generating unit, wherein the differential relation includes nodes specifying the plural pieces of configuration information, edges connecting between the nodes, and edge weights specifying lightness/heaviness of the edges, and
   a differential relation correcting unit that corrects the differential relation by newly generating a node and setting edge weights of edges connecting the newly generated node and another one of the nodes to "0".

2. The configuration information writing apparatus according to claim 1, wherein the order information generating unit generates the order information to minimize a sum of the edge weights.

3. A configuration information writing method to be executed by a configuration information writing apparatus for writing configuration information defining a logical configuration of a logic circuit device into the logic circuit device to change the logical configuration thereof, the method comprising:
   a difference extracting step of acquiring plural pieces of configuration information and extracting differences between each of the acquired plural pieces of configuration information;
   a differential relation generating step of generating a differential relation indicating a relation of the differences between each of the plural pieces of configuration information based on the differences extracted by the difference extracting step;
   an order information generating step of generating order information specifying a circulation order of writing all the pieces of configuration information, from the relation of the differences indicated by the differential relation generated by the differential relation generating step, wherein the differential relation includes nodes specifying the plural pieces of configuration information, edges connecting between the nodes, and edge weights specifying lightness/heaviness of the edges, and
   a differential relation correcting step of correcting the differential relation by newly generating a node and setting edge weights of edges connecting the newly generated node and another one of the nodes to "0".

4. A non-transitory computer-readable storage medium tangibly recording a computer program which allows a computer for writing configuration information defining a logical configuration of a logic circuit device into the logic circuit device for changing the logical configuration thereof to execute:
   a difference extracting step of acquiring plural pieces of configuration information and extracting differences between each of the acquired plural pieces of configuration information;
   a differential relation generating step of generating a differential relation indicating a relation of the differences between each of the plural pieces of configuration information based on the differences extracted by the difference extracting step;
   an order information generating step of generating order information specifying a circulation order of writing all the pieces of configuration information, from the relation of the differences indicated by the differential relation generated by the differential relation generating step, wherein the differential relation includes nodes specifying the plural pieces of configuration information, edges connecting between the nodes, and edge weights specifying lightness/heaviness of the edges, and
   a differential relation correcting step of correcting the differential relation by newly generating a node and setting edge weights of edges connecting the newly generated node and another one of the nodes to "0".

* * * * *